(12) United States Patent
Ito et al.

(10) Patent No.: US 12,738,330 B2
(45) Date of Patent: Sep. 15, 2026

(54) POWER SUPPLY APPARATUS AND MEMORY SYSTEM

(71) Applicant: TDK Corporation, Tokyo (JP)

(72) Inventors: Yugi Ito, Tokyo (JP); Norikazu Okako, Tokyo (JP); Yuki Tada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 106 days.

(21) Appl. No.: 19/008,041

(22) Filed: Jan. 2, 2025

(65) Prior Publication Data

US 2025/0246249 A1 Jul. 31, 2025

(30) Foreign Application Priority Data

Jan. 26, 2024 (JP) ................................ 2024-010248

(51) Int. Cl.
*G11C 16/30* (2006.01)
*H02M 3/158* (2006.01)

(52) U.S. Cl.
CPC ............ *G11C 16/30* (2013.01); *H02M 3/158* (2013.01)

(58) Field of Classification Search
CPC ...................................................... G11C 16/30
USPC .................................................... 365/185.18
See application file for complete search history.

(56) References Cited

U.S. PATENT DOCUMENTS 5,440,521 A * 8/1995 Tsunozaki .............. H10B 12/30 365/231
2024/0039409 A1* 2/2024 Gataric .................. H02J 7/865

FOREIGN PATENT DOCUMENTS

JP 6299443 B2 3/2018

* cited by examiner

*Primary Examiner* — Muna A Techane
(74) *Attorney, Agent, or Firm* — Oliff PLC

(57) ABSTRACT

A power supply apparatus includes: a power supply terminal receiving a first voltage from outside; one or more step-down circuits each generating a second voltage to be supplied to a memory device; first and second coupling lines disposed parallel to each other and individually coupling the power supply terminal and the step-down circuit(s) to each other; a first switching device disposed on the first coupling line, between the power supply terminal and the step-down circuit(s); a step-up circuit disposed on the second coupling line and stepping up the first voltage supplied from the power supply terminal; a first capacitor disposed on the second coupling line, between the step-up circuit and the step-down circuit(s); a second switching device disposed on the second coupling line, between the step-up circuit(s) and the first capacitor, and a third switching device disposed on the second coupling line, between the first capacitor and the step-down circuit(s).

8 Claims, 5 Drawing Sheets

POWER SUPPLY APPARATUS AND MEMORY SYSTEM

CROSS-REFERENCE TO RELATED APPLICATIONS

The present application claims priority from Japanese Patent Application No. 2024-010248 filed on Jan. 26, 2024, the entire contents of which are hereby incorporated by reference.

BACKGROUND

The disclosure relates to a power supply apparatus configured to generate a voltage to be supplied to a memory device, and a memory system including the power supply apparatus and the memory device.

Various memory systems have been proposed that each include a power supply apparatus and a memory device such as a flash memory. For example, reference is made to Japanese Patent No. 6299443.

SUMMARY

A power supply apparatus according to one embodiment of the disclosure is configured to generate a voltage to be supplied to a memory device. The power supply apparatus includes a power supply terminal, one or more step-down circuits, a first coupling line and a second coupling line, a first switching device, a step-up circuit, a first capacitor, a second switching device, and a third switching device. The power supply terminal is configured to receive a first voltage from outside. The one or more step-down circuits are each configured to generate a second voltage to be supplied to the memory device. The first coupling line and the second coupling line are disposed parallel to each other and individually couple the power supply terminal and the one or more step-down circuits to each other. The first switching device is disposed on the first coupling line at a location between the power supply terminal and the one or more step-down circuits. The step-up circuit is disposed on the second coupling line and configured to step up the first voltage supplied from the power supply terminal. The first capacitor is disposed on the second coupling line at a location between the step-up circuit and the one or more step-down circuits. The second switching device is disposed on the second coupling line at a location between the step-up circuit and the first capacitor. The third switching device is disposed on the second coupling line at a location between the first capacitor and the one or more step-down circuits.

A memory system according to one embodiment of the disclosure includes a power supply apparatus and a memory device. The power supply apparatus is configured to generate a voltage to be supplied to the memory device. The power supply apparatus includes a power supply terminal, one or more step-down circuits, a first coupling line and a second coupling line, a first switching device, a step-up circuit, a first capacitor, a second switching device, and a third switching device. The power supply terminal is configured to receive a first voltage from outside. The one or more step-down circuits are each configured to generate a second voltage to be supplied to the memory device. The first coupling line and the second coupling line are disposed parallel to each other and individually couple the power supply terminal and the one or more step-down circuits to each other. The first switching device is disposed on the first coupling line at a location between the power supply terminal and the one or more step-down circuits. The step-up circuit is disposed on the second coupling line and configured to step up the first voltage supplied from the power supply terminal. The first capacitor is disposed on the second coupling line at a location between the step-up circuit and the one or more step-down circuits. The second switching device is disposed on the second coupling line at a location between the step-up circuit and the first capacitor. The third switching device is disposed on the second coupling line at a location between the first capacitor and the one or more step-down circuits.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
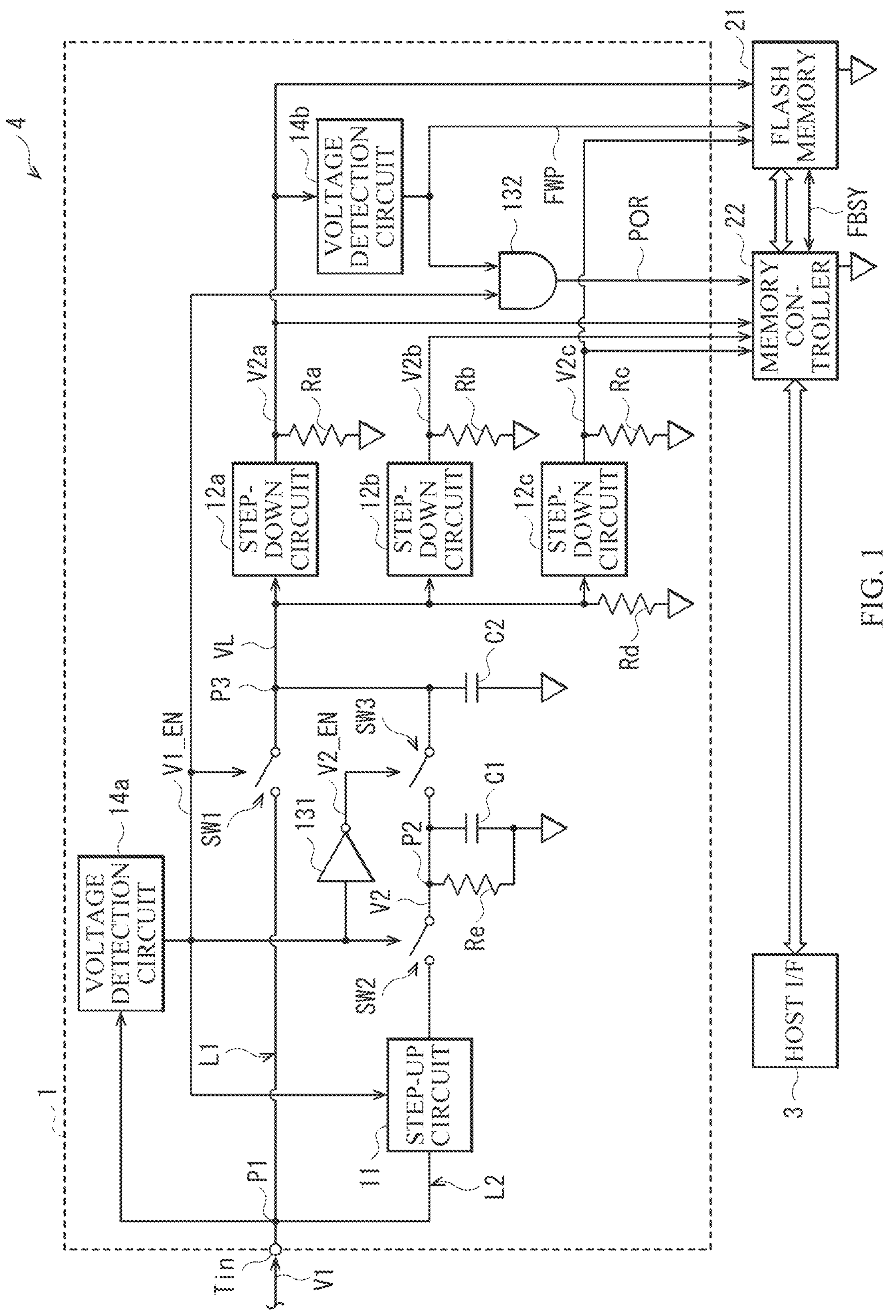
FIG. 1 is a circuit diagram illustrating a schematic configuration example of a memory system according to one example embodiment of the disclosure.

Improved convenience is demanded of a system such as a memory system that includes a memory device and a power supply apparatus.

It is desirable to provide a power supply apparatus that makes it possible to improve convenience, and a memory system including such a power supply apparatus.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings. Note that the description is given in the following order.

1. Example Embodiment: an example of application to a memory system including a flash memory and a power supply apparatus
2. Modification Examples

1. EXAMPLE EMBODIMENT

Configuration

FIG. 1 is a circuit diagram illustrating a schematic configuration example of a memory system 4 according to an example embodiment of the disclosure. The memory system 4 may be a system such as a flash memory system applicable to a memory device such as a flash memory device. Non-limiting examples of the memory device may include a flash memory 21 to be described later. As illustrated in FIG. 1, the memory system 4 may include a power supply apparatus 1, the flash memory 21, a memory controller 22, and a host interface (I/F) 3.

Flash Memory 21, Etc.

The flash memory 21 may be a nonvolatile memory in which data supplied from outside (i.e., from a host) via the host I/F 3 is to be stored, as indicated by arrows in FIG. 1. The host I/F 3 will be described later. The memory controller 22 may be a controller that performs operations including, as indicated by the arrows in FIG. 1, a write operation to write data supplied from the host via the host I/F 3 to the flash memory 21 and a read operation to read data stored in the flash memory 21.

The flash memory 21 may transmit to the memory controller 22 a signal FBSY that indicates whether the flash memory 21 is capable of accepting a command from the memory controller 22. For example, the signal FBSY being "H" (high) may indicate that the flash memory 21 is capable of accepting a command from the memory controller 22, that is, the flash memory 21 is accessible from the memory controller 22. In contrast, the signal FBSY being "L" (low) may indicate that the flash memory 21 is incapable of accepting a command from the memory controller 22, that is, the flash memory 21 is busy and thus inaccessible from the memory controller 22. The flash memory 21 is busy during a write period over which data received from the memory controller 22 is being written to a cell in the flash memory 21. If power-down occurs in the write period, that is, if a later-described voltage V1 supplied from outside falls below a predetermined threshold in the write period, there is a high possibility that the data in the flash memory 21 will be corrupted.

The flash memory 21 and the memory controller 22 may each correspond to a specific but non-limiting example of a "memory device" in one embodiment of the disclosure.

The host I/F 3 may be an interface for data transfer between the memory system 4 (i.e., the flash memory 21 and the memory controller 22) and the host. The host I/F 3 may be an interface for solid state drives (SSDs), for example. Non-limiting examples of such a host I/F 3 may include Serial Advanced Technology Attachment (SATA), Parallel Advanced Technology Attachment (PATA), and Peripheral Component Interconnect-Express (PCIe).

Power Supply Apparatus 1

The power supply apparatus 1 generates a voltage to be supplied to the memory device described above, that is, each of the flash memory 21 and the memory controller 22. The voltage may include voltages V2*a* to V2*c* to be described later. As illustrated in FIG. 1, the power supply apparatus 1 may include a power supply terminal Tin, coupling lines L1 and L2, a step-up circuit 11, a plurality of (e.g., three) step-down circuits 12*a* to 12*c*, a logical negation (NOT) circuit 131, a logical conjunction (AND) circuit 132, voltage detection circuits 14*a* and 14*b*, switching devices SW1 to SW3, capacitors C1 and C2, and dummy resistors Ra to Re.

The coupling line L1 may correspond to a specific but non-limiting example of a "first coupling line" in one embodiment of the disclosure. The coupling line L2 may correspond to a specific but non-limiting example of a "second coupling line" in one embodiment of the disclosure. The voltage detection circuit 14*a* may correspond to a specific but non-limiting example of a "voltage detection circuit" in one embodiment of the disclosure. The switching device SWI may correspond to a specific but non-limiting example of a "first switching device" in one embodiment of the disclosure. The switching device SW2 may correspond to a specific but non-limiting example of a "second switching device" in one embodiment of the disclosure. The switching device SW3 may correspond to a specific but non-limiting example of a "third switching device" in one embodiment of the disclosure. The capacitor C1 may correspond to a specific but non-limiting example of a "first capacitor" in one embodiment of the disclosure. The capacitor C2 may correspond to a specific but non-limiting example of a "second capacitor" in one embodiment of the disclosure.

The power supply terminal Tin may be a terminal to receive the voltage V1 (i.e., a host supply voltage) from outside the memory system 4 (i.e., from the host), as illustrated in FIG. 1. The voltage V1 may be 3.3 V, for example.

The coupling lines L1 and L2 are disposed parallel to each other and individually couple the power supply terminal Tin and the step-down circuits 12*a* to 12*c* to each other. The step-down circuits 12*a* to 12*c* will be described later. For example, as illustrated in FIG. 1, the coupling line L1 may be coupled to the step-down circuits 12*a* to 12*c* through a node P1, the switching device SW1, and a node P3 in this order from the power supply terminal Tin. The coupling line L2 may be coupled to the step-down circuits 12*a* to 12*c* through the node P1, the step-up circuit 11, the switching device SW2, a node P2, the switching device SW3, and the node P3 in this order from the power supply terminal Tin.

The step-up circuit 11 is disposed on the coupling line L2, as described above. The step-up circuit 11 may be a circuit that steps up the voltage V1 of, for example, 3.3 V supplied from the power supply terminal Tin, and outputs a voltage V2 of, for example, 5 V as a step-up voltage. The voltage V2 may serve as a voltage for power backup in the event of power-down (i.e., a case where the voltage V1 falls below a predetermined threshold) to be described later, and may be stored as electric charge in the capacitor C1 to be described later.

As illustrated in FIG. 1, the step-down circuits 12*a* to 12*c* may step down a voltage VL supplied from the foregoing coupling line L1 or L2 through the node P3, and thereby respectively generate voltages V2*a* to V2*c* as step-down voltages each of which is to be supplied to the memory controller 22 or to both the flash memory 21 and the memory controller 22. For example, the step-down circuit 12*a* may step down the voltage VL into the voltage V2*a* and supply the voltage V2*a* to each of the flash memory 21 and the memory controller 22. The step-down circuit 12*b* may step down the voltage VL into the voltage V2*b* and supply the voltage V2*b* to the memory controller 22. The step-down circuit 12*c* may step down the voltage VL into the voltage V2*c* and supply the voltage V2*c* to each of the flash memory 21 and the memory controller 22. Note that in the example embodiment illustrated in FIG. 1, respective values of the voltages V2*a* to V2*c* may satisfy the following magnitude relationship: V2*a*≥V2*b*≥V2*c*. In this way, in the example embodiment, the voltages V2*a* to V2*c* outputted from the multiple step-down circuits 12*a* to 12*c* may have respective different voltage values appropriate to the memory device (i.e., each of the flash memory 21 and the memory controller 22).

The voltage V1 described above may correspond to a specific but non-limiting example of a "first voltage" in one embodiment of the disclosure. The voltages V2*a* to V2*c* may each correspond to a specific but non-limiting example of a "second voltage" in one embodiment of the disclosure.

The voltage detection circuit 14*a* may be a circuit that detects the voltage V1 supplied from the power supply terminal Tin through the node P1, as illustrated in FIG. 1. As will be described in detail later, the voltage detection circuit 14*a* may output a signal V1_EN that is "L" or "H" depending on a magnitude of the voltage V1 having been detected, that is, depending on a magnitude relationship between the voltage V1 and a predetermined threshold voltage Vth. When the signal V1_EN is "L", the switching devices SW1 and SW2 to be described later may each be set to an off-state (i.e., a blocking state), the switching device SW3 to be described later may be set to an on-state (i.e., a coupling state), and the step-up circuit 11 may be set to a stopped state. In contrast, when the signal V1_EN is "H", the switching devices SW1 and SW2 may each be set to an on-state, the switching device SW3 may be set to an off-state, and the step-up circuit 11 may be set to an operating state. Switching each of the switching devices SW1 to SW3 between the on-state or the off-state in such a manner allows for controlling a supply path for electric power in the power supply apparatus 1. The supply path for the electric power may include power supply routes Rp1 and Rp2 to be described later.

The voltage detection circuit 14*b* may be a circuit that detects the voltage V2*a* outputted from the step-down circuit 12*a*, as illustrated in FIG. 1. The voltage detection circuit 14*b* may output a signal FWP that is "L" or "H" depending on the magnitude of the voltage V2*a* having been detected. When the signal FWP is "L", the write operation to write data to the flash memory 21 may be disabled. When the signal FWP is "H", the write operation to write data to the flash memory 21 may be enabled, that is, the disabling of the write operation may be canceled.

The NOT circuit 131 may be a circuit that outputs a signal V2_EN of "H" or "L" that is an inverted signal as a resultant of logical inversion of the signal V1_EN of "L" or "H" outputted from the voltage detection circuit 14*a*. For example, when the signal V1_EN is 'L", the signal V2_EN is "H", and when the signal V1_EN is 'H", the signal V2_EN is "L". The signal V2_EN generated in such a manner may be supplied to the switching device SW3, as illustrated in FIG. 1.

The AND circuit 132 may be a circuit that outputs a signal POR to the memory controller 22, as illustrated in FIG. 1. The signal POR may be a logical conjunction (AND) of the signal V1_EN outputted from the voltage detection circuit 14*a* and the signal FWP outputted from the voltage detection circuit 14*b*. When the signal POR is "L", the operations of the memory controller 22 may be stopped. When the signal POR is "H", the operations of the memory controller 22 may be enabled, that is, the stopping of the operations of the memory controller 22 may be canceled.

The switching device SW1 is disposed on the coupling line L1 at a location between the power supply terminal Tin and the step-down circuits 12*a* to 12*c*, that is, between the node P1 and the node P3, as illustrated in FIG. 1. The switching device SW1 may be set to the on-state or the off-state in accordance with the signal V1_EN outputted from the voltage detection circuit 14*a*. The switching device SW2 is disposed on the coupling line L2 at a location between the step-up circuit 11 and the capacitor C1, that is, between the step-up circuit 11 and the node P2. The switching device SW2 may be set to the on-state or the off-state in accordance with the signal V1_EN outputted from the voltage detection circuit 14*a*. The switching device SW3 is disposed on the coupling line L2 at a location between the capacitor C1 and the step-down circuits 12*a* to 12*c*, that is, between the node P2 and the node P3. The switching device SW3 may be set to the on-state or the off-state in accordance with the signal V2_EN outputted from the NOT circuit 131.

These switching devices SW1 to SW3 may each include a switching device having a capability of preventing a reverse flow.

The capacitor C1 may be a large-capacitance capacitor disposed on the coupling line L2 at a location between the step-up circuit 11 and the step-down circuits 12*a* to 12*c*, as illustrated in FIG. 1. For example, the capacitor C1 may have a first end coupled to the node P2 and a second end coupled to a ground. The capacitor C1 may serve as a backup capacitor adapted to supply electric charge to the flash memory 21 and the memory controller 22 during power-down (i.e., when the voltage V1 falls below the predetermined threshold) to be described later. As will be described in detail later, in the event of the power-down, the electric charge is supplied from the capacitor C1 to the step-down circuits 12*a* to 12*c*, which secures power supply to the flash memory 21 when the flash memory 21 is busy. This helps to prevent data in the flash memory 21 from being corrupted.

The capacitor C2 may be an assist capacitor disposed on the coupling line L2 at a location between the switching device SW3 and the step-down circuits 12*a* to 12*c*, as illustrated in FIG. 1. For example, the capacitor C2 may have a first end coupled to the node P3 and a second end coupled to the ground. The capacitor C2 may assist with a predetermined delay time, that is, a delay time in switching of each of the switching devices SW1 and SW2 from the on-state to the off-state and switching of the switching device SW3 from the off-state to the on-state, when the power-down described above occurs.

The dummy resistors Ra to Re may each be a resistor for discharging surplus electric charge. As illustrated in FIG. 1, the dummy resistor Ra may be disposed between an output line of the voltage V2*a* from the step-down circuit 12*a* and the ground. Similarly, the dummy resistor Rb may be disposed between an output line of the voltage V2*b* from the step-down circuit 12*b* and the ground, and the dummy resistor Rc may be disposed between an output line of the voltage V2*c* from the step-down circuit 12*c* and the ground. The dummy resistor Rd may be disposed between an input line of the step-down circuits 12*a* to 12*c*, that is, the node P3, and the ground. The dummy resistor Re may be disposed parallel to the capacitor C1 at a location between the node P2 and the ground.

Operations, Workings, and Example Effects

Now, with reference to FIGS. 2 to 5 as well as FIG. 1, an operation example of the example embodiment, that is, an example of operations of the memory system 4 and the power supply apparatus 1 will be described in detail in comparison with a comparative example.

A. COMPARATIVE EXAMPLE

Figure 2:
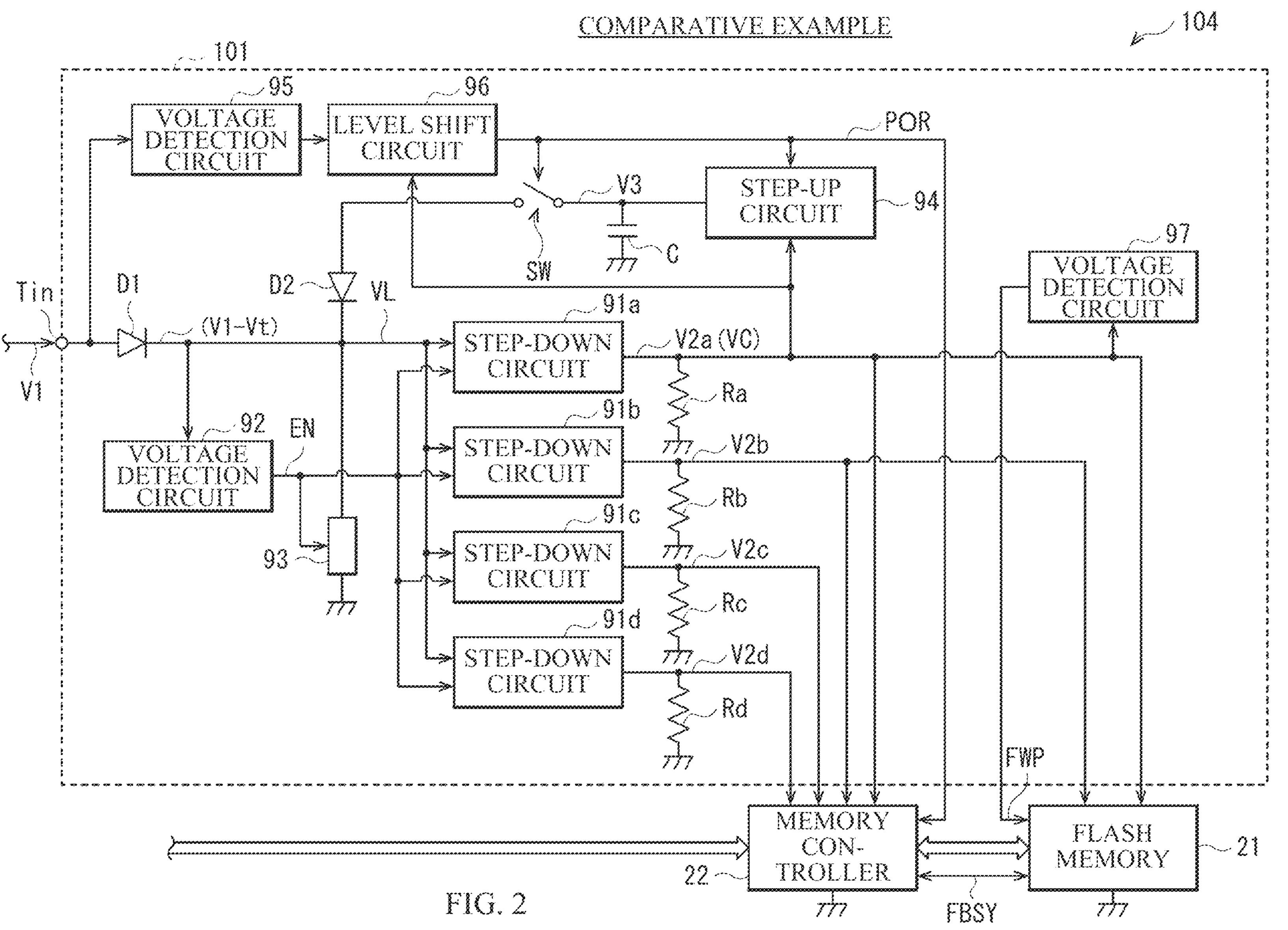
FIG. 2 is a circuit diagram illustrating a schematic configuration of a memory system according to a comparative example.

FIG. 2 is a circuit diagram illustrating a schematic configuration of a memory system 104 according to a comparative example. The memory system 104 of the comparative example corresponds to the memory system 4 of the example embodiment illustrated in FIG. 1 in which the power supply apparatus 1 is replaced with a power supply apparatus 101. As illustrated in FIG. 2, the power supply apparatus 101 of the comparative example may include the power supply terminal Tin, four step-down circuits 91*a* to 91*d*, a voltage detection circuit 92, a discharge circuit 93, a step-up circuit 94, voltage detection circuits 95 and 97, a level shift circuit 96, a switching device SW, a capacitor C, diodes D1 and D2, and the dummy resistors Ra to Rd.

In the power supply apparatus 101, the voltage V1 received at the power supply terminal Tin may be detected by the voltage detection circuit 95, subjected to a level shift by the level shift circuit 96, and thereby supplied as the signal POR to each of the switching device SW, the step-up circuit 94, and the memory controller 22. Further, a voltage (V1-Vt) obtained through the diode D1 from the power supply terminal Tin may be detected by the voltage detection circuit 92, and a signal EN outputted from the voltage detection circuit 92 may be supplied to each of the discharge circuit 93 and the step-down circuits 91*a* to 91*d*. The above-described voltage (V1-Vt) may be stepped down at the step-down circuits 91*a*, 91*b*, 91*c*, and 91*d* and thereby outputted as voltages V2*a* (VC), V2*b*, V2*c*, and V2*d*, respectively. Each of these voltages V2*a* (VC), V2*b*, V2*c*, and V2*d* may be supplied to the memory controller 22 or to both the flash memory 21 and the memory controller 22. The voltage V2*a* (VC) may be detected at the voltage detection circuit 97, and the signal FWP may be supplied to the flash memory 21. The voltage V2*a* (VC) may also be supplied to each of the step-up circuit 94 and the level shift circuit 96. A voltage V3 outputted as a step-up voltage from the step-up circuit 94 may be supplied to the capacitor C, and may also be supplied to the discharge circuit 93 through the switching device SW and the diode D2. The dummy resistors Ra to Rd may each be disposed between an output line of corresponding one of the step-down circuits 91*a* to 91*d* and the ground.

In the power supply apparatus 101 having such a configuration, a voltage necessary at each of the flash memory 21 and the memory controller 22 may be generated at corresponding one or more of the step-down circuits 91*a* to 91*d* through the use of the voltage V1 supplied from outside (i.e., from the host) to the power supply terminal Tin. Further, the voltage V2*a* (VC) outputted from the step-down circuit 91*a* may be stepped up by the step-up circuit 94 into the voltage V3, and the voltage V3 may be used to charge the capacitor C.

In the power supply apparatus 101, when a drop in the voltage V1 (i.e., the occurrence of power-down) is detected by the voltage detection circuit 95, the operations of the memory controller 22 may be stopped by the signal POR outputted from the level shift circuit 96. Further, the signal POR may cause the switching device SW to switch from the off-state to the on-state to thereby allow the electric charge stored in the capacitor C (a large-capacitance capacitor) to be supplied to each of the step-down circuits 91*a* to 91*d* through the switching device SW and the diode D2, which allows for securing of a power supply voltage, i.e., the voltage VL. In this way, the power supply voltage (i.e., the voltage VL) of each of the step-down circuits 91*a* to 91*d* is securable while the flash memory 21 is busy, that is, during a period of data writing to a cell. Thus, data under writing is securable even in the event of the power-down while the flash memory 21 is busy.

However, in the power supply apparatus 101 or the memory system 104 of the comparative example, as illustrated in FIG. 2, the voltage V1 supplied from the host decreases by a forward voltage Vt at the diode D1 provided for reverse flow prevention, that is, the voltage V1 decreases to the voltage (V1-Vt). Accordingly, for example, when the voltage V1 is relatively low (i.e., of a low-voltage system), a voltage margin decreases, that is, it becomes difficult to allow for a voltage margin. This can make it difficult to use such a voltage V1 of the low-voltage system, and can thus lead to a reduction in convenience.

B. OPERATION EXAMPLE OF EXAMPLE EMBODIMENT

In contrast, the memory system 4 of the example embodiment may perform, for example, the following operations with the circuit configuration illustrated in FIG. 1.

Figure 3:
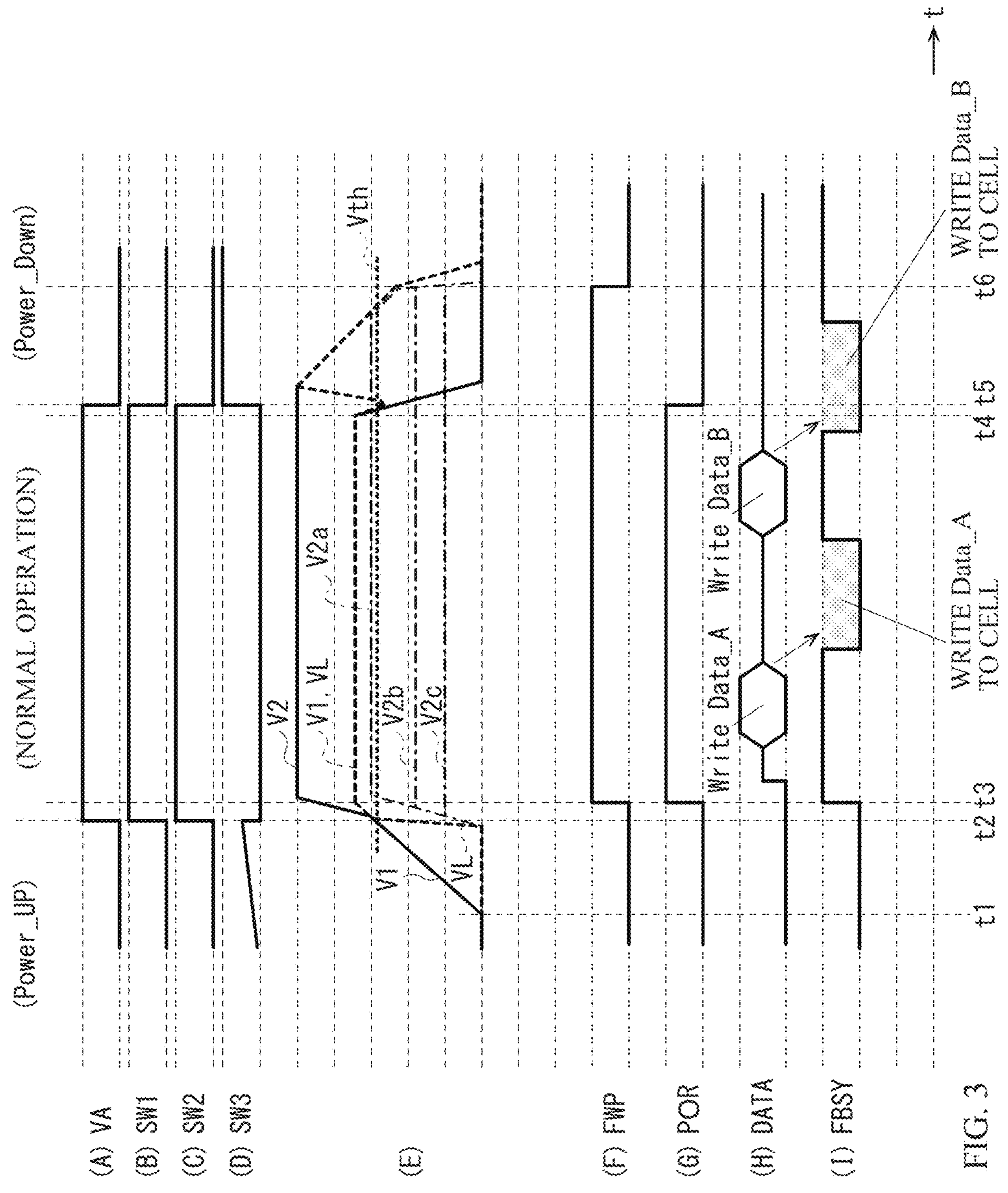
FIG. 3 is a timing diagram illustrating an operation example of the memory system illustrated in FIG. 1.

FIG. 3 is a timing diagram illustrating an operation example of the memory system 4 illustrated in FIG. 1, that is, an example of operations during a normal operation, during "Power_Down", and during "Power_Up" to be described later. For example, part (A) of FIG. 3 illustrates a voltage VA indicating a state of detection of the voltage V1 by the voltage detection circuit 14*a*, and parts (B) to (D) of FIG. 3 illustrate the on-and off-states of the switching devices SW1 to SW3, respectively. Part (E) of FIG. 3 illustrates the foregoing voltages V1, V2, V2*a* to V2*c*, and VL together. Parts (F), (G), and (I) of FIG. 3 illustrate the foregoing signals FWP, POR, and FBSY, respectively. Part (H) of FIG. 3 illustrates data (DATA) supplied to the flash memory 21. In FIG. 3, the horizontal axis represents time t. Timings tl to t6 along the time t are indicated in FIG. 3.

Figure 4:
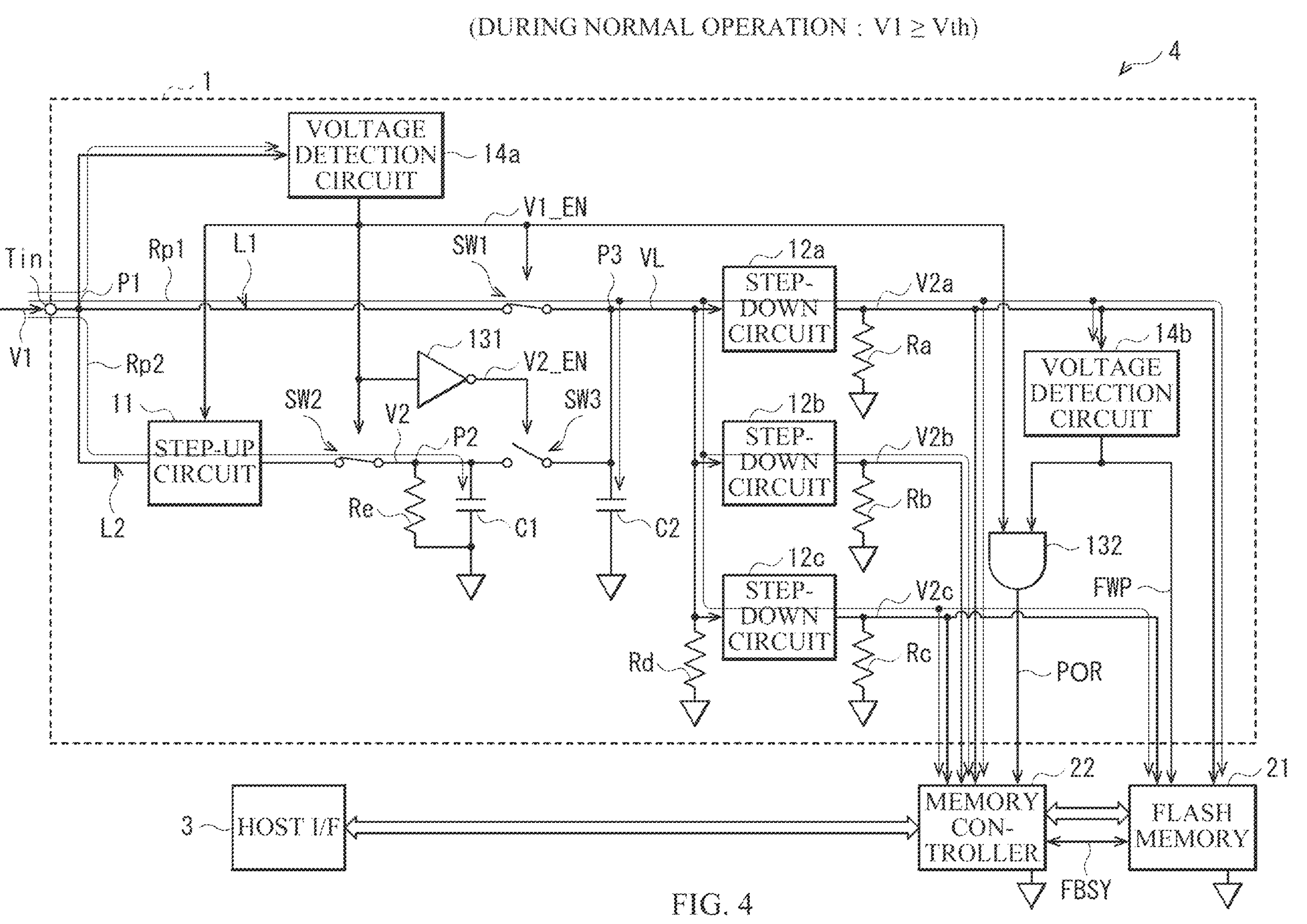
FIG. 4 is a circuit diagram illustrating an example of an operation state during normal operation in FIG. 3.
Figure 5:
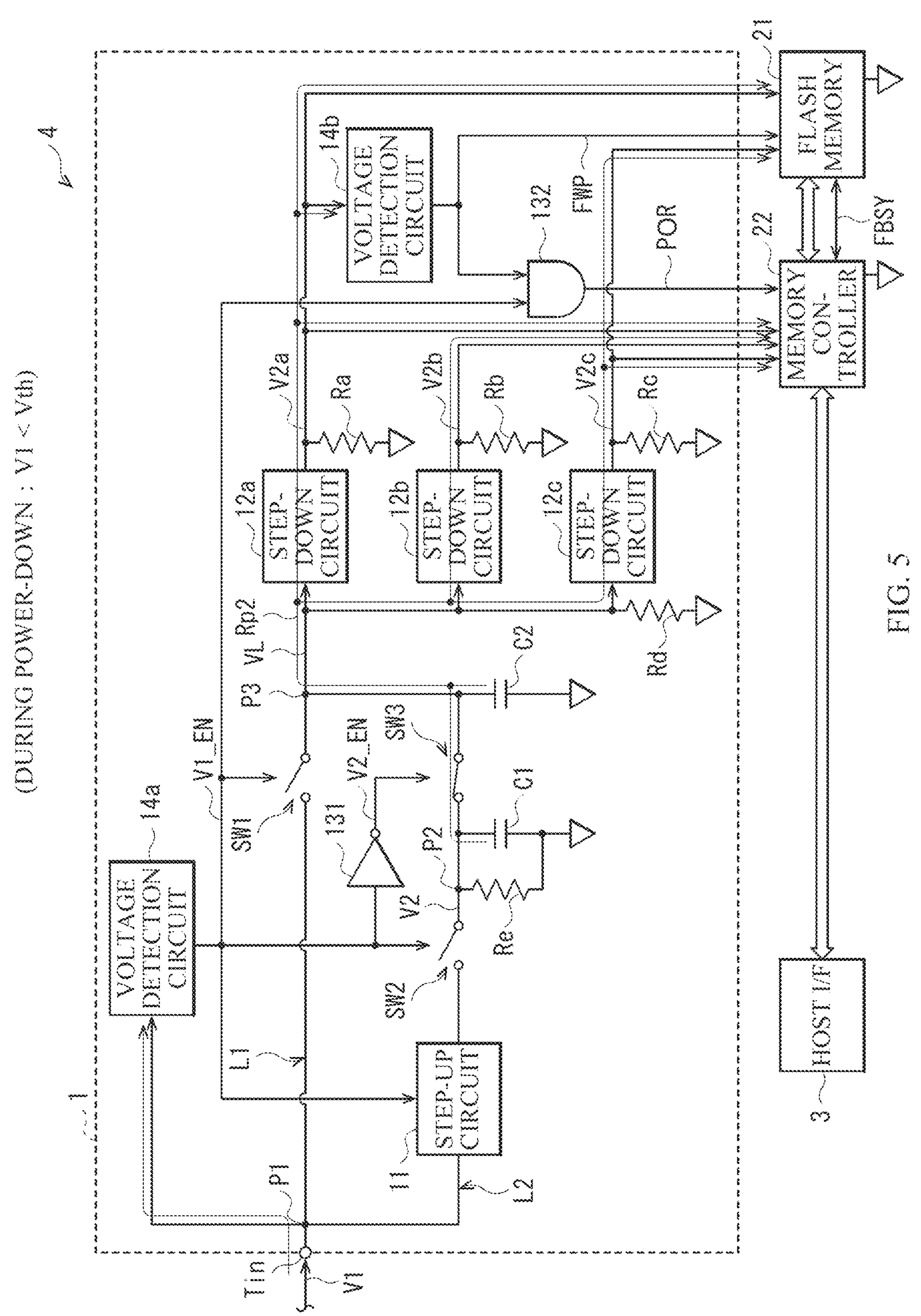
FIG. 5 is a circuit diagram illustrating an example of an operation state during power-down in FIG. 3.

FIG. 4 is a circuit diagram illustrating an example of an operation state during the normal operation in FIG. 3, that is, during a period from the timing t2 to the timing t5 in FIG. 3 in which the voltage V1 is higher than or equal to the threshold voltage Vth. FIG. 5 is a circuit diagram illustrating an example of an operation state during power-down ("Power_Down") in FIG. 3, that is, when the voltage V1 is lower than the threshold voltage Vth (i.e., a period after the timing t5 in FIG. 3). Note that a period from a start to the timing t2 may correspond to a "Power-Up" period in which the voltage V1 is lower than the threshold voltage Vth. In FIGS. 4 and 5, the power supply routes Rp1 and Rp2 described below are indicated by respective arrows.

B-1. During Normal Operation

During the normal operation illustrated in FIG. 3, the memory system 4 of the example embodiment may operate, for example, in a manner illustrated in FIG. 4.

For example, during the normal operation, the signal V1_EN is "H" and the signal V2_EN is "L" because the voltage V1 received at the power supply terminal Tin is higher than or equal to the predetermined threshold voltage Vth (e.g., 2.7 V), that is, V1≥Vth, as illustrated in parts (A) and (E) of FIG. 3. The voltage detection circuit 14*a* may thus set the switching devices SW1 and SW2 to the on-state, and set the switching device SW3 to the off-state, as illustrated in parts (B) to (D) of FIG. 3. Further, the step-up circuit 11 may be set to be in the operating state during the normal operation. As a result, as illustrated in FIG. 4, the following two power supply routes Rp1 and Rp2 are provided in the power supply apparatus 1.

The power supply route Rp1 may allow each of the voltages V2*a* to V2*c* to be supplied from corresponding one of the step-down circuits 12*a* to 12*c* to the memory controller 22 or to both the flash memory 21 and the memory controller 22, based on the voltage V1 that is received at the power supply terminal Tin and supplied as the voltage VL to each of the step-down circuits 12*a* to 12*c* through the coupling line L1, as illustrated in FIG. 4. Thus, during the normal operation, the power supply route Rp1 may be used to supply each of the voltages V2*a* to V2*c* to the memory controller 22 or to both the flash memory 21 and the memory controller 22. Further, during the normal operation, the power supply route Rp1 may also be used to supply the voltage V1 (VL) to the capacitor C2 along with the step-down circuits 12*a* to 12*c,* as illustrated in FIG. 4, to thereby charge the capacitor C2.

The power supply route Rp2 may allow the voltage V1 to be supplied from the power supply terminal Tin to the step-up circuit 11 through the coupling line L2, and allow the voltage V2 outputted as the step-up voltage from the step-up circuit 11 to be supplied to the capacitor C1 through the switching device SW2, as illustrated in FIG. 4. For example, during the normal operation, the power supply route Rp2 may be used to charge the capacitor C1, based on the voltage V2. Note that during the normal operation, the switching device SW3 may be in the off-state as described above, which allows no electric power to be supplied through the power supply route Rp2 to the step-down circuits 12*a* to 12*c,* as illustrated in FIG. 4.

Further, during the normal operation, the voltage V2*a* may be monitored by the voltage detection circuit 14*b*. If it is confirmed that the voltage V2*a* is sufficiently high as power supply to the flash memory 21, the signal FWP may turn "H", as illustrated in part (F) of FIG. 3. This causes the signal POR outputted from the AND circuit 132 to turn "H" as illustrated in part (G) of FIG. 3, because the signal V1_EN is "H" as described above. The memory controller 22 may be thereby brought into the operating state. Accordingly, as illustrated in parts (H) and (I) of FIG. 3, for example, based on data (DATA including Write DATA_A and Write Data_B) supplied to the flash memory 21, data writing may be performed on a cell in the flash memory 21 during a period over which the signal FBSY is "L".

The power supply route Rp1 described above may correspond to a specific but non-limiting example of a "first power supply route" in one embodiment of the disclosure. The power supply route Rp2 described above may correspond to a specific but non-limiting example of a "second power supply route" in one embodiment of the disclosure.

B-2. During Power-Down

During power-down illustrated in FIG. 3, the memory system 4 of the example embodiment may operate, for example, in a manner illustrated in FIG. 5.

For example, during the power-down, the signal V1_EN is "L" and the signal V2_EN is "H" because the voltage V1 received at the power supply terminal Tin is lower than the threshold voltage Vth, that is, V1<Vth, as illustrated in parts (A) and (E) of FIG. 3. The voltage detection circuit 14*a* may thus set the switching devices SW1 and SW2 to the off-state, and set the switching device SW3 to the on-state, as illustrated in parts (B) to (D) of FIG. 3. Further, the operation of the step-up circuit 11 may be set to be in the stopped state during the power-down. In addition, because the signal V1_EN is "L" as described above, the signal POR outputted from the AND circuit 132 may also turn "L" as illustrated in part (G) of FIG. 3, which brings the operations of the memory controller 22 also into the stopped state.

As a result, during the power-down, the following operations may be performed through the power supply route Rp2 described above, as illustrated in FIG. 5. For example, electric power stored in the capacitors C1 and C2 may be supplied to the step-down circuits 12*a* to 12*c*. Based on the supplied electric power, the voltages 2Va to 2Vc may each be supplied from corresponding one of the step-down circuits 12*a* to 12*c* to the memory controller 22 or to both the flash memory 21 and the memory controller 22 (see FIG. 5). Thus, during the power-down, the voltages V2*a* to V2*c* may each be supplied through the power supply route Rp2 to the memory controller 22 or to both the flash memory 21 and the memory controller 22. Note that during the power-down, the switching devices SW1 and SW2 may be in the off-state as described above, which helps to prevent the electric power stored in the capacitors C1 and C2 from escaping toward the host through the power supply terminal Tin.

In this way, according to the example embodiment, even when power-down occurs, that is, even during "Power-_Down" in FIG. 3, the following is achievable regarding the period over which the flash memory 21 is busy, that is, the period of data writing to a cell. For example, power supply voltages (i.e., the voltages V2*a* to V2*c* described above) are retained over a predetermined period of time. See a period from the timing t5 to the timing t6 in parts (E) and (I) of FIG. 3. Note that the capacitor C1 as a large-capacitance capacitor may have a capacitance large enough to retain a time duration greater than or equal to that of the period over which the flash memory 21 is busy, that is, the period of data writing to a cell. This allows for securing of data even if power-down occurs in the period of data writing to a cell in the flash memory 21.

In the comparative example described above, for example, the voltage V1 may be 5.0 V, a detection voltage obtained at the voltage detection circuit 95 may be 4.0 V, and the voltage V2*a* may be 3.3 V; thus, differences between these voltages are relatively large. Accordingly, in the comparative example, a Schottky diode (i.e., the diode D1) may be used to reduce a reverse flow of electric charge and to supplement a switching time of the switching device SW. In contrast, in the example embodiment, for example, the voltage V1 may be 3.3 V, a detection voltage obtained at the voltage detection circuit 14*a* may be 2.8 V, and the voltage V2*a* may be 3.0 V; thus, differences between these voltages are relatively small. Accordingly, in the example embodiment, instead of using a Schottky diode such as one used in the comparative example, switching devices (i.e., the switching devices SW1 to SW3) are used that cause no loss of a forward voltage. Further, as described above, the capacitor C2 may be provided as the assist capacitor to prolong the switching time of each of the switching devices SW1 to SW3.

Note that during the power-down, the operations of the memory controller 22, including an internal operation and a communication operation with the flash memory 21, are stopped as described above. This results in a sudden decrease in load of the voltage V1, which can lead to a momentary rise in the voltage V1. In such a case, the voltage detection circuit 14*a* can respond to the momentary rise in the voltage V1, which can result in switching of the signal POR from "L" to "H" or result in an erroneous operation of any of the switching devices SW1 to SW3. To address this, in detecting the voltage V1 at the voltage detection circuit 14*a*, for example, a hysteresis may be provided on the threshold voltage Vth described above. For example, when the voltage V1 rises, the voltage detection circuit 14*a* may switch the signal V1_EN from "L" to "H" if the voltage V1 exceeds a threshold voltage Vth1 of 2.75 V. In contrast, when the voltage V1 drops, the voltage detection circuit 14*a* may switch the signal V1_EN from "H" to "L" if the voltage V1 falls below a threshold voltage Vth2 of 2.65 V. Providing the hysteresis on the threshold voltage Vth in such a manner helps to prevent the erroneous operation described above.

C. WORKINGS AND EXAMPLE EFFECTS

In the example embodiment, the switching devices SW1 to SW3, the step-up circuit 11, and the capacitor C1 are each provided in the above-described configuration on corresponding one of the coupling lines L1 and L2 that individually couple the power supply terminal Tin and the step-down circuits 12*a* to 12*c* to each other. As a result, the following are achievable when electric power is supplied to the step-down circuits 12*a* to 12*c* through the coupling line L1 or L2, based on the voltage V1 supplied from the power supply terminal Tin. For example, in contrast to the comparative example described above, the example embodiment is free from a drop in the voltage V1 caused by a forward voltage at the diode provided for reverse flow prevention. Accordingly, for example, even if the voltage V1 is relatively low (i.e., of a low-voltage system), it is easier to provide a voltage margin when supplying electric power. This helps to improve convenience of the power supply apparatus 1 and the memory system 4, as compared with the comparative example.

Further, in the example embodiment, the two power supply routes Rp1 and Rp2 described above may be provided. During the normal operation where V1≥Vth, the power supply route Rp1 may be used to supply each of the voltages V2*a* to V2*c* to the memory controller 22 or to both the flash memory 21 and the memory controller 22. During the power-down where V1<Vth, the power supply route Rp2 may be used to supply each of the voltage V2*a* to V2*c* to the memory controller 22 or to both the flash memory 21 and the memory controller 22. In this way, the power supply route for use is switchable between the power supply routes Rp1 and Rp2 in accordance with the magnitude relationship between the voltage V1 and the threshold voltage Vth. This helps to effectively provide the above-described margin in power supply, which in turn helps to achieve further improvement in convenience.

Further, in the example embodiment, the capacitor C2 serving as the assist capacitor may be provided between the switching device SW3 and the step-down circuits 12*a* to 12*c* on the coupling line L2. As described above, the capacitor C2 may assist with the predetermined delay time, that is, the delay time in switching of each of the switching devices SW1 and SW2 from the on-state to the off-state and switching of the switching device SW3 from the off-state to the on-state, when the power-down occurs. This helps to achieve further improvement in convenience.

Furthermore, in the example embodiment, the multiple step-down circuits 12*a* to 12*c* are provided and the voltages V2*a* to V2*c* respectively outputted from the step-down circuits 12*a* to 12*c* may have respective different voltage values appropriate to each of the flash memory 21 and the memory controller 22. This helps to allow each of the flash memory 21 and the memory controller 22 to perform appropriate operations easily, which in turn helps to achieve further improvement in convenience.

2. MODIFICATION EXAMPLES

The disclosure has been described hereinabove with reference to the example embodiment; however, the disclosure is not limited thereto, and may be modified in a variety of ways.

For example, in the example embodiment, the description has been given of an example of circuit configurations of the memory system and the power supply apparatus; however, such an example is non-limiting, and any of other suitable circuit configurations may be employed.

For example, in the example embodiment, the description has been given of an example case where the power supply apparatus includes three step-down circuits; however, such an example is non-limiting. In some embodiments, the power supply apparatus may include a single step-down circuit, two step-down circuits, or four or more step-down circuits.

Further, in the example embodiment, the description has been given of an example case where the power supply apparatus includes two capacitors C1 and C2, i.e., the first and second capacitors; however, such an example is non-limiting. In some embodiments, the power supply apparatus may include the capacitor C1 (i.e., the first capacitor) alone, without the capacitor C2 (i.e., the second capacitor).

Further, in the example embodiment, the description has been given of an example case where the memory system includes the flash memory and the memory controller that each correspond to a specific but non-limiting example of the "memory device" in one embodiment of the disclosure; however, such an example is non-limiting. In some embodiments, the memory system may include either one of the flash memory or the memory controller.

Further, in the example embodiment, the description has been given of an example case where the voltage detection circuit 14*a* may output the signal V1_EN that is "L" or "H" depending on the magnitude of the voltage V1 having been detected, that is, depending on the magnitude relationship between the voltage V1 and the predetermined threshold voltage Vth, and where the signal V1_EN may be used to make setting of each of the switching devices SW1 to SW3. However, such an example is non-limiting. In some embodiments, two voltage detection circuits to detect the voltage V1 may be provided and so controlled that a first one of the two voltage detection circuits makes setting of each of the switching devices SW1 and SW2 and a second one of the two voltage detection circuits makes setting of the switching device SW3. Further, in some embodiments, the two voltage detection circuits may have their respective threshold voltages Vth that differ in value from each other.

Further, in the example embodiment, the description has been given of example operations of the memory system and the power supply apparatus; however, the example operations are non-limiting, and any other suitable operations may be employed.

Further, in the example embodiment, the description has been given of an example of the memory system such as the flash memory system applicable to a memory device (e.g., a flash memory device) such as a flash memory; however, such an example is non-limiting. In some embodiments, the memory system according to an embodiment of the disclosure may be applied to a memory device other than the flash memory device.

Moreover, any two or more of the configuration examples and other examples described so far may be combined and applied in a desired manner. The disclosure encompasses any possible combination of some or all of the various embodiments described herein and incorporated herein.

It is possible to achieve at least the following configurations from the foregoing example embodiment and modification examples of the disclosure.

(1)

A power supply apparatus configured to generate a voltage to be supplied to a memory device, the power supply apparatus including:

a power supply terminal configured to receive a first voltage from outside;

one or more step-down circuits each configured to generate a second voltage to be supplied to the memory device;

a first coupling line and a second coupling line disposed parallel to each other and individually coupling the power supply terminal and the one or more step-down circuits to each other;

a first switching device disposed on the first coupling line at a location between the power supply terminal and the one or more step-down circuits;

a step-up circuit disposed on the second coupling line and configured to step up the first voltage supplied from the power supply terminal;

a first capacitor disposed on the second coupling line at a location between the step-up circuit and the one or more step-down circuits;

a second switching device disposed on the second coupling line at a location between the step-up circuit and the first capacitor; and a third switching device disposed on the second coupling line at a location between the first capacitor and the one or more step-down circuits.

(2)

The power supply apparatus according to (1), further including:

a first power supply route through which the second voltage is to be supplied from each of the one or more step-down circuits to the memory device, based on the first voltage supplied to the one or more step-down circuits through the first coupling line; and a second power supply route through which the second voltage is to be supplied from each of the one or more step-down circuits to the memory device, based on electric power that is stored in the first capacitor and supplied to the one or more step-down circuits through the second coupling line.

(3)

The power supply apparatus according to (2), in which the power supply apparatus is configured to:

supply the second voltage to the memory device through the first power supply route when the first voltage is higher than or equal to a threshold voltage; and supply the second voltage to the memory device through the second power supply route when the first voltage is lower than the threshold voltage.

(4)

The power supply apparatus according to any one of (1) to (3), further including a second capacitor disposed on the second coupling line at a location between the third switching device and the one or more step-down circuits.

(5)

The power supply apparatus according to (4), further including a voltage detection circuit configured to detect the first voltage, the voltage detection circuit being configured to:

perform control, when the first voltage is higher than or equal to a threshold voltage, to cause the first voltage to be supplied to each of the one or more step-down circuits and the second capacitor and to cause a step-up voltage outputted from the step-up circuit to be supplied to the first capacitor, by setting each of the first and second switching devices to an on-state and setting the third switching device to an off-state; and perform control, when the first voltage is lower than the threshold voltage, to cause electric power stored in each of the first capacitor and the second capacitor to be supplied to the one or more step-down circuits, by setting each of the first and second switching devices to an off-state and setting the third switching device to an on-state.

(6)

The power supply apparatus according to any one of (1) to (5), in which the one or more step-down circuits include a plurality of the step-down circuits, and the plurality of step-down circuits is configured to generate and output a plurality of the second voltages, the second voltages outputted from the step-down circuits having respective different voltage values that are appropriate to the memory device.

(7)

The power supply apparatus according to any one of (1) to (6), in which the memory device includes a flash memory, a memory controller, or both.

(8)

A memory system including:

the power supply apparatus according to any one of (1) to (7); and the memory device.

The power supply apparatus and the memory system according to at least one embodiment of the disclosure each make it possible to improve convenience.

The effects described herein are mere examples and non-limiting, and other effects may be achieved.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims.

The limitations in the claims are to be interpreted broadly based on the language employed in the claims and not limited to examples described in this specification or during the prosecution of the application, and the examples are to be construed as non-exclusive.

As used in this specification and the appended claims, the singular forms “a,” “an,” and “the” include, especially in the context of the claims, are to be construed to cover both the singular and the plural, unless otherwise indicated herein or clearly contradicted by context.

Throughout this specification and the appended claims, unless the context requires otherwise, the terms “comprise”, “include”, “have”, and their variations are to be construed to cover the inclusion of a stated element, integer or step but not the exclusion of any other non-stated element, integer or step.

The use of the terms first, second, etc. do not denote any order or importance, but rather the terms first, second, etc. are used to distinguish one element from another.

The term "substantially", "approximately", "about", and its variants having the similar meaning thereto are defined as being largely but not necessarily wholly what is specified as understood by one of ordinary skill in the art.

The term "disposed on/provided on/formed on" and its variants having the similar meaning thereto as used herein refer to elements disposed directly in contact with each other or indirectly by having intervening structures therebetween.

What is claimed is:

1. A power supply apparatus configured to generate a voltage to be supplied to a memory device, the power supply apparatus comprising:

a power supply terminal configured to receive a first voltage from outside;

one or more step-down circuits each configured to generate a second voltage to be supplied to the memory device;

a first coupling line and a second coupling line disposed parallel to each other and individually coupling the power supply terminal and the one or more step-down circuits to each other;

a first switching device disposed on the first coupling line at a location between the power supply terminal and the one or more step-down circuits;

a step-up circuit disposed on the second coupling line and configured to step up the first voltage supplied from the power supply terminal;

a first capacitor disposed on the second coupling line at a location between the step-up circuit and the one or more step-down circuits;

a second switching device disposed on the second coupling line at a location between the step-up circuit and the first capacitor; and a third switching device disposed on the second coupling line at a location between the first capacitor and the one or more step-down circuits.

2. The power supply apparatus according to claim 1, further comprising:

a first power supply route through which the second voltage is to be supplied from each of the one or more step-down circuits to the memory device, based on the first voltage supplied to the one or more step-down circuits through the first coupling line; and a second power supply route through which the second voltage is to be supplied from each of the one or more step-down circuits to the memory device, based on electric power that is stored in the first capacitor and supplied to the one or more step-down circuits through the second coupling line.

3. The power supply apparatus according to claim 2, wherein the power supply apparatus is configured to:

supply the second voltage to the memory device through the first power supply route when the first voltage is higher than or equal to a threshold voltage; and supply the second voltage to the memory device through the second power supply route when the first voltage is lower than the threshold voltage.

4. The power supply apparatus according to claim 1, further comprising a second capacitor disposed on the second coupling line at a location between the third switching device and the one or more step-down circuits.

5. The power supply apparatus according to claim 4, further comprising a voltage detection circuit configured to detect the first voltage, the voltage detection circuit being configured to:

perform control, when the first voltage is higher than or equal to a threshold voltage, to cause the first voltage to be supplied to each of the one or more step-down circuits and the second capacitor and to cause a step-up voltage outputted from the step-up circuit to be supplied to the first capacitor, by setting each of the first and second switching devices to an on-state and setting the third switching device to an off-state; and perform control, when the first voltage is lower than the threshold voltage, to cause electric power stored in each of the first capacitor and the second capacitor to be supplied to the one or more step-down circuits, by setting each of the first and second switching devices to an off-state and setting the third switching device to an on-state.

6. The power supply apparatus according to claim 1, wherein the one or more step-down circuits comprise a plurality of the step-down circuits, and the plurality of step-down circuits is configured to generate and output a plurality of the second voltages, the second voltages outputted from the step-down circuits having respective different voltage values that are each appropriate to the memory device.

7. The power supply apparatus according to claim 1, wherein the memory device comprises a flash memory, a memory controller, or both.

8. A memory system including:

the power supply apparatus according to claim 1; and the memory device.

* * * * *